(12) United States Patent
Harima et al.

(10) Patent No.: US 6,369,976 B1
(45) Date of Patent: Apr. 9, 2002

(54) MAGNETIC TAPE RECORDING/REPRODUCING APPARATUS WITH A CAM TO DETECT OPERATING MODE SHIFT

(75) Inventors: Masahiro Harima; Naoki Tatsumi, both of Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/407,793

(22) Filed: Sep. 29, 1999

(30) Foreign Application Priority Data

Oct. 2, 1998 (JP) ............................................. 10-281556

(51) Int. Cl.$^7$ .............................................. G11B 15/00
(52) U.S. Cl. ........................................................ 360/96.5
(58) Field of Search ......................................... 360/96.5

(56) References Cited

U.S. PATENT DOCUMENTS

| | | | |
|---|---|---|---|
| 4,972,278 A | * 11/1990 | Hara et al. | ...................... 360/94 |
| 5,712,744 A | 1/1998 | Sakama et al. | ................ 360/85 |
| 5,798,783 A | * 8/1998 | Maslanka et al. | ........... 347/215 |

FOREIGN PATENT DOCUMENTS

| | | | |
|---|---|---|---|
| DE | 3740947 | 6/1989 | ........... G11B/15/06 |
| EP | 0567041 | 10/1993 | ......... G11B/15/675 |
| JP | 70176119 | 7/1995 | ......... G11B/15/665 |

* cited by examiner

*Primary Examiner*—David Davis
(74) *Attorney, Agent, or Firm*—Ladas & Parry

(57) ABSTRACT

A magnetic tape recording/reproducing apparatus adapted for loading a magnetic tape cassette has a magnetic head, a magnetic tape loading mechanism that loads and unloads a magnetic tape cassette and loads and unloads a magnetic tape within the magnetic tape cassette to the magnetic head, the magnetic tape loading mechanism assuming a plurality of operating states and an optical detector for optically detecting a shifting of the magnetic tape loading mechanism from one operating state to another operating state. By using non-contact type optical detectors instead of contact-type detectors to detect a shift of operating states from one state to another, the reliability of detection readings can be improved and at the same time the problem of wear on the conventional electrode pattern can be eliminated.

2 Claims, 9 Drawing Sheets

MAGNETIC TAPE RECORDING/REPRODUCING APPARATUS WITH A CAM TO DETECT OPERATING MODE SHIFT

BACKGROUND OF THE INVENTION

1. Field of the Invention

The present invention relates generally to a magnetic tape recording/reproducing apparatus, and more particularly, to a digital audio tape recorder (hereinafter "DAT") streamer in which a motor rotates a cam gear to put the DAT streamer into one of a plurality of different operating modes.

2. Description of the Related Art

DAT streamers are used as large-capacity external memory back-up devices for computers. The typical DAT streamer is composed of a cam gear rotated by a motor, with a variety of mechanisms activated in response to the rotation of the cam gear so as to put the DAT streamer into a magnetic tape cassette load mode, a tape insert mode, a recording/reproducing mode and the like. Such a configuration requires that the shifting of the operating modes be detected with a high degree of reliability.

Figure 1A:
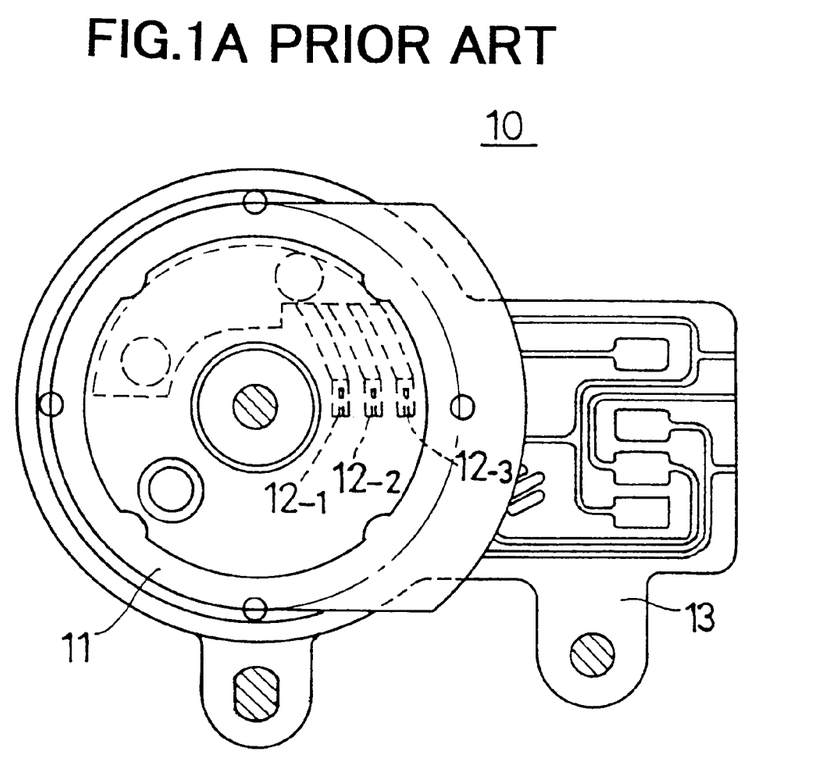
FIGS. 1A and 1B are top and side views of an example of the prior art, respectively.
Figure 1B:
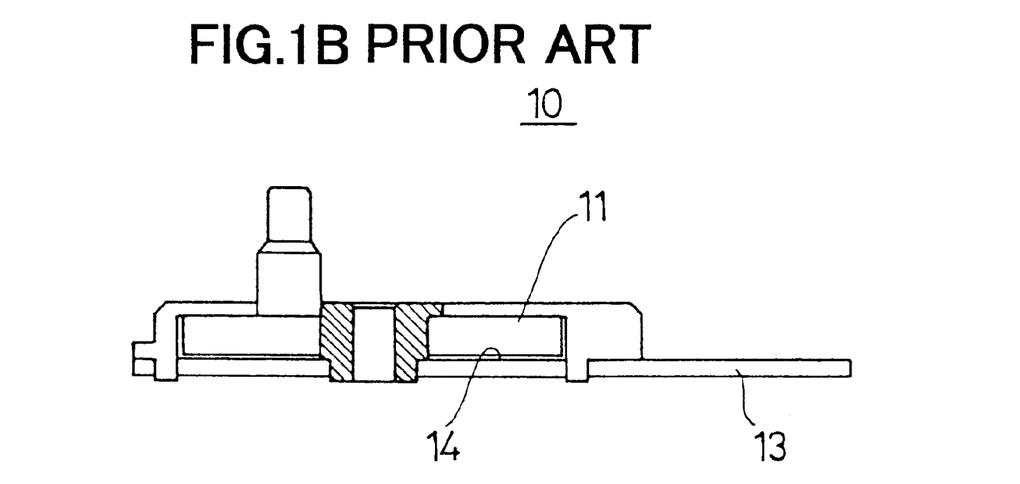

An example of a conventional DAT streamer operating mode shift detection device is shown in FIGS. 1A and 1B. As can be appreciated from the drawings, such a device consists of a rotating plate 11 rotating in synchrony with a cam gear. Three leaf spring contacts 12-1, 12-2 and 12-3 are disposed on the rotating plate 11 in such a way as to slide over an electrode pattern 14 of predetermined shape of a circuit board 13, so that a shifting of operating modes is detected by a combination of the output of the contacts 12-1, 12-2 and 12-3.

The operating mode shift detection device described above is a metal contact type. As a result, the reliability of the detection readings is easily affected by the intensity of the pressure of the contact, the quality of the grease, the presence of dirt and dust, and so on. The reliability of the detection readings can be improved by increasing the intensity of the pressure of the contact. However, doing so increases the wear on the electrode pattern 14 and shortens its life.

SUMMARY OF THE INVENTION

Accordingly, it is a general object of the present invention to provide an improved and useful magnetic tape recording/reproducing apparatus in which the problems described above are eliminated. Another more specific object of the present invention is to provide a magnetic tape recording/reproducing apparatus capable of detecting an operating mode shift with a high degree of reliability.

The above-described objects of the present invention are achieved by a magnetic tape recording/reproducing apparatus adapted for loading a magnetic tape cassette, comprising:

a magnetic head;

a magnetic tape loading mechanism loading and unloading a magnetic tape cassette and loading and unloading a magnetic tape within the magnetic tape cassette to the magnetic head, the magnetic tape loading mechanism assuming a plurality of operating states; and an optical detector for optically detecting a shifting of the magnetic tape loading mechanism from one operating state to another operating state.

According to the invention described above, the operating mode shift detection device is a non-contact type. Accordingly, the effect of the presence of dirt and dust on the reliability of the detection readings is much reduced as compared to the contact-type operating mode shift detection device. As a result, the reliability of detection readings can be improved and at the same time the problem of wear on the electrode pattern 14 can be eliminated.

Additionally, the above-described objects of the present invention are also achieved by a magnetic tape recording/reproducing apparatus adapted to load a magnetic tape cassette, comprising:

a magnetic head;

a cam gear rotatably driven by a motor;

a magnetic tape loading mechanism operated by the rotation of the cam gear, the magnetic tape loading mechanism loading and unloading the magnetic tape cassette and loading and unloading a magnetic tape inside the magnetic tape cassette to the magnetic head, the magnetic tape loading mechanism assuming a plurality of operating states;

a rotating member rotating in synchrony with the cam gear and having a plurality of optical detectors;

a switch detecting a loading of the magnetic tape cassette; and a control circuit detecting a shifting of the magnetic tape loading mechanism from one operating state to another operating state based on an output from the plurality of optical detectors and an output from the switch.

According to the invention described above, by using the output of the switch detecting the loading of the magnetic tape cassette it becomes possible to reduce the number of photosensors to a small number. Accordingly, even a rotating member having a relatively small diameter is adequate to accommodate the optical detectors.

Other objects, features and advantages of the present invention will become more apparent from the following detailed description when read in conjunction with the accompanying drawings.

DESCRIPTION OF THE PREFERRED EMBODIMENT

A description will now be given of an embodiment of the present invention with reference to the accompanying drawings.

Figure 2:
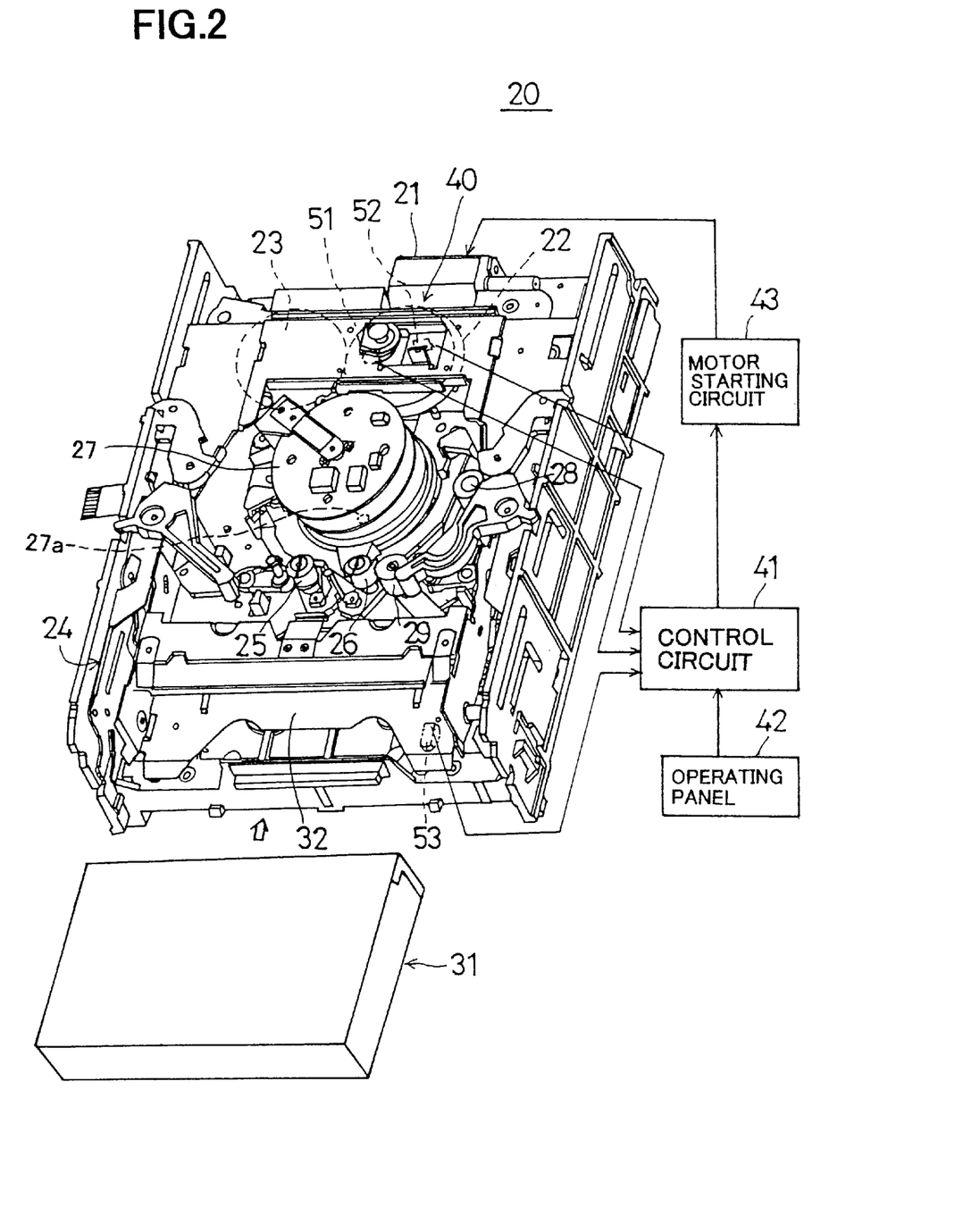
FIG. 2 is a diagram showing a plan view of an embodiment of a DAT streamer according to the present invention.

FIG. 2 is a diagram showing a plan view of an embodiment of a DAT streamer according to the present invention. The DAT streamer 20 has a motor 21, a mode gear 22, a cam gear 23, a cassette housing mechanism 24, loading poles 25, 26, a rotating drum 27 having rotating magnetic heads 27a, a capstan 28, a pinch roller 29 and a head cleaning member 30.

Figure 4:
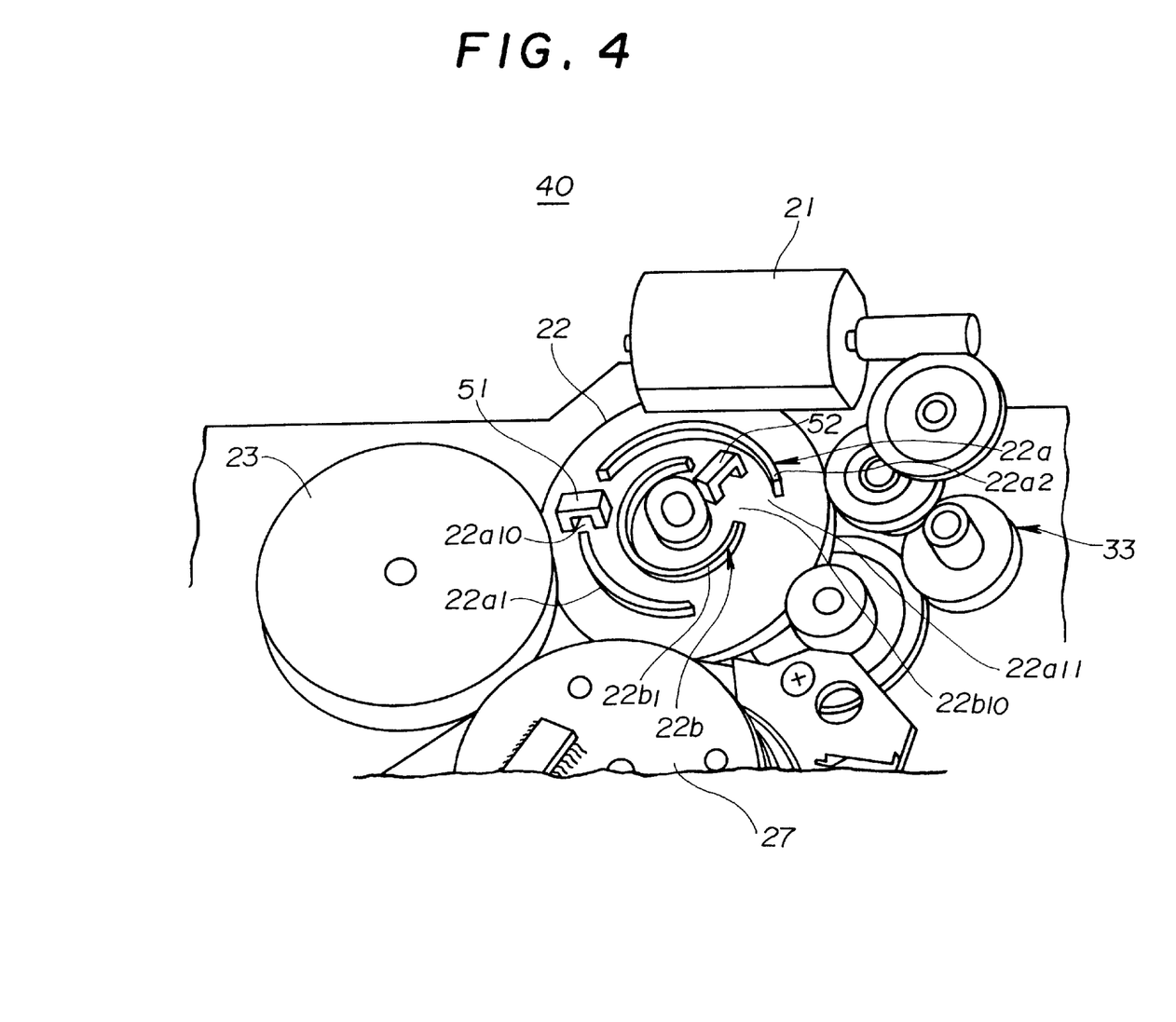
FIG. 4 is a diagram showing a portion of the operating mode shift detection device shown in FIG. 2.
Figure 5:
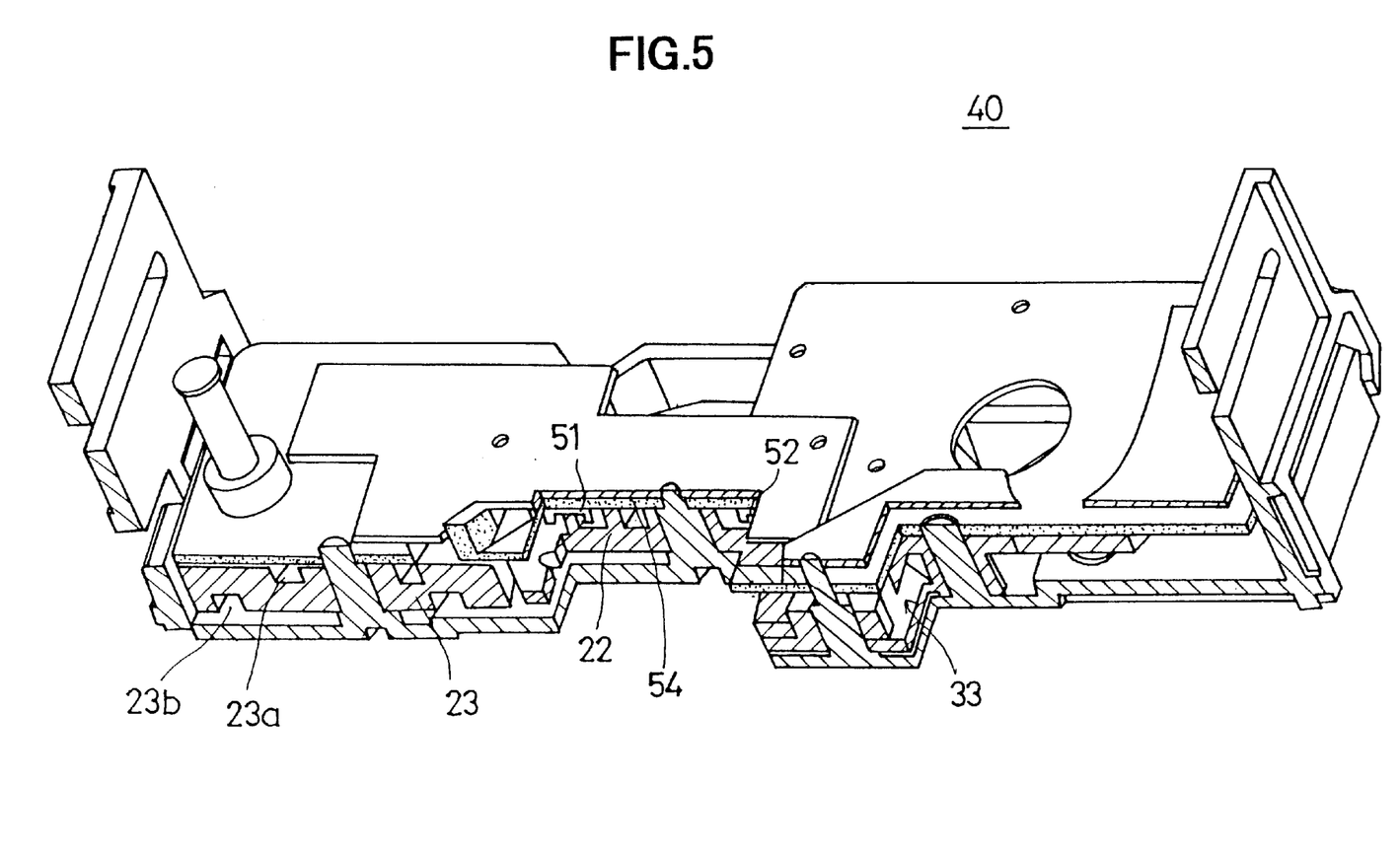
FIG. 5 is a diagram showing a portion of the operating mode shift detection device shown in FIG. 2.

When a DAT cassette 31 is inserted into a cassette housing 32, the DAT streamer 20 motor 21 starts and begins to rotate in the forward direction and, as shown in FIG. 4 and FIG. 5, the cam gear 23 rotates via a reduction gear mechanism 33 and the mode gear 22 in a counter-clockwise direction within an angle of approximately 330 degrees. A first cam and a second cam are formed on an upper surface and a lower surface of the cam gear 23. When the cam gear 23 rotates the cassette housing mechanism 24, the loading poles 25, 26 and the pinch roller 29 are activated and the DAT streamer 20 is put into a variety of operating modes. Thereafter, when the motor 21 reverses the cam gear 23 reverses, that is, rotates in a clockwise direction, and the DAT streamer operates in the reverse of the order described above.

In actuality, the cam gear 23 rotates clockwise or counter-clockwise to a predetermined angle in response to buttons operated by an operator and stops at that predetermined angular position. Here, for simplicity of explanation, it is assumed that the cam gear 23, being at a reference position, is rotated counter-clockwise to a final position and thereafter rotated clockwise to a final position and returned to the reference position.

When the cam gear 23 rotates clockwise the DAT streamer 20 is in an unload mode. Here it is defined that the mode of the DAT streamer 20 when the cam gear 23 rotates counter-clockwise is a "load mode".

Figure 3A:
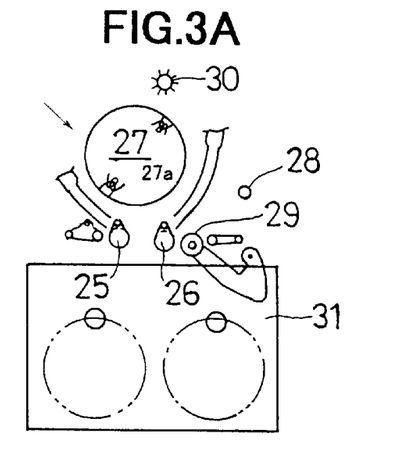
FIGS. 3A, 3B, 3C, 3D, 3E and 3F are schematic views of states of operating modes of the DAT streamer shown in FIG. 2.

Initially, the DAT streamer 20 is in an eject mode shown in FIG. 3A. When the cam gear 23 begins to rotate counter-clockwise, a link not shown in the drawing is moved by a first cam 23a, which is depicted in FIG. 5, the cassette housing mechanism 24 is operated so as to load a cassette, the DAT cassette 31 is partly moved and the DAT streamer 20 is put into a semi-eject mode shown in FIG. 3B. Thereafter, the DAT cassette 31 is loaded and the DAT streamer 20 is put into an unthread mode shown in FIG. 3C.

Figure 3B:
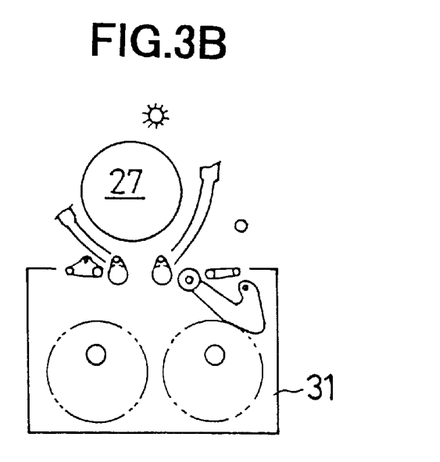
Figure 3C:
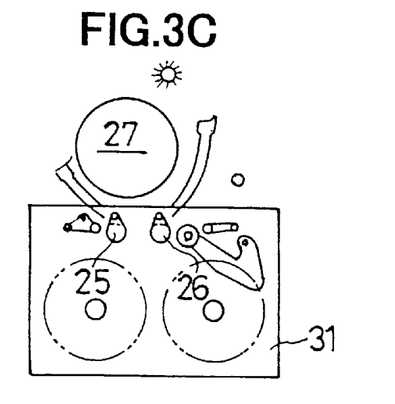
Figure 3D:
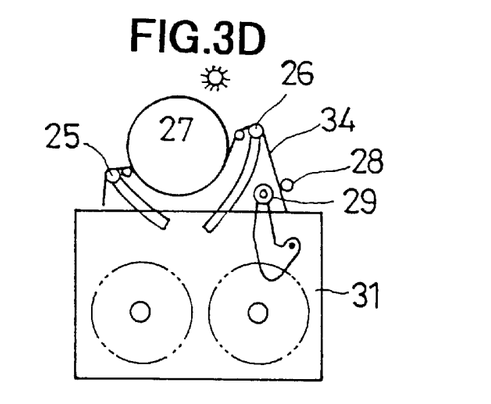

Next, a link and a slide plate, neither of which is depicted in the drawing, are moved by the second cam 23b, which is depicted in FIG. 5, the loading poles 25, 26 are moved toward the rotating drum 27, magnetic tape 34 is extracted from the loaded DAT cassette 31 and wound around the rotating drum 27 as shown in FIG. 3D. At this time the pinch roller 29 is not yet pressed against the capstan 28 and the DAT streamer 20 is in a stop mode.

Figure 3E:
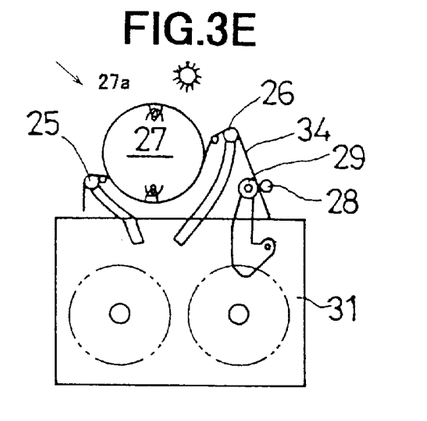

Next, as shown in FIG. 3E, the pinch roller 29 is pressed against the capstan 28, the magnetic tape 34 is run and the DAT streamer 20 is put into a recording/reproducing mode.

Figure 3F:
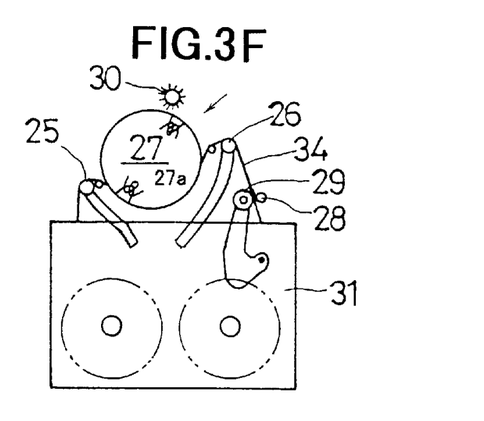

Finally, as shown in FIG. 3F, the head cleaning member 30 is contacted with the rotating drum 27 to clean the magnetic heads 27a and the DAT streamer 20 is put into a rotating head cleaning mode.

As the cam gear 23 is rotated clockwise, the DAT streamer 20 changes from the recording/reproducing mode shown in FIG. 3E to the stop mode shown in FIG. 3D to the unthread mode shown in FIG. 3C to the semi-eject mode shown in FIG. 3B, and finally to the eject mode shown in FIG. 3A.

In actuality, the operating mode data from the operating mode shift detection device 40 that detects the shifting of the various operating modes is supplied to a control circuit 41.

An operator operates the control panel 42, operating mode commands are input to the control circuit 41 from the operating panel 42, the control circuit 41 outputs a motor drive signal based on the operating mode information and operating mode commands and the motor drive circuit 43 drives the motor 21. The motor 21 is driven in response to the controls operated by the operator, the cam gear is rotated through a predetermined angle in either a clockwise or counter-clockwise direction and stopped thereat and the DAT streamer 20 is put into the desired operating mode.

Next, a description will be given of the operating mode shift detection device 40.

As shown in FIG. 4 and FIG. 5, the operating mode shift detection device 40 comprises a mode gear 22 synchronized to the cam gear 23 and rotating in the reverse direction of the cam gear 23, first and second annular ribs 22a, 22b formed on an upper surface of the mode gear 22, a first photocoupler 51, a second photocoupler 52, a cassette loading recognition switch 53 and a portion of the control circuit 41. FIG. 4 shows the DAT streamer 40 in an eject mode state.

The first and second annular ribs 22a, 22b are formed integrally with and concentrically on the upper surface of the mode gear 22. The first annular rib 22a is composed of rib portions 22a1 and 22a2 as well as notched portions 22a10 and 22a11. The second annular rib 22b is composed of rib portion 22b1 and notched portion 22b10. The first photocoupler 51 and the second photocoupler 52 have a U-shaped main body on which light-emitting elements and light-receiving elements are disposed so as to be opposed to each other. The first and second photocouplers 51 and 52 are fixedly mounted on a printed circuit board 54 that is itself mounted on the chassis, so as to cover an upper surface of the mode gear 22.

The first photocoupler 51 straddles the first annular rib 22a. Light from a light-emitting element is cut off by the rib portions 22a1 and 22a2 and does not reach a light-receiving element. Instead, light from the light-emitting element is received at the light-receiving element via the notched portions 22a10 and 22a11. The first photocoupler 51 is at a level LOW "0" when the light-receiving element is not receiving any light and outputs a signal that becomes a level HIGH "1" when the light-receiving element is receiving light. The first annular rib 22a has a predetermined shape so that the photocoupler 51 outputs the signal shown in FIG. 6D in response to the rotation of the mode gear 22.

The second photocoupler 52 straddles the second annular rib 22b. Light from a light-emitting element is cut off by the rib portion 22b1 and does not reach a light-receiving element. Instead, light from the light-emitting element is received at the light-receiving element via the notched portion 22b10. The second photocoupler 52 is at a level LOW "0" when the light-receiving element is not receiving any light and outputs a signal that becomes a level HIGH "1" when the light-receiving element is receiving light. The second annular rib 22b has a predetermined shape so that the photocoupler 51 outputs the signal shown in FIG. 6E in response to the rotation of the mode gear 22.

The cassette loading recognition switch 53 is provided at a location pressed by a bottom surface of the DAT cassette 31. The cassette loading recognition switch 53 is at a level HIGH "1" when the light-receiving element is not receiving any light and outputs a signal that becomes a level LOW "0" when the light-receiving element is receiving light. The cassette loading recognition switch 53 outputs the signal shown in FIG. 6C.

The control circuit 41 mentioned above performs the detection of the shifting of the twelve operating modes depending on the combination of signals from the first photocoupler 51, the second photocoupler 52 and the cassette loading recognition switch 53. The twelve shifts of operating modes consist of the six shifts when loaded and the six shifts when unloaded.

In a case in which a single sensor outputs a "0" or "1" signal, two sensors are inadequate for detecting the twelve shifts of operating modes and, accordingly, three are required. However, it is difficult to fit three such sensors on the mode gear 22 due to restricted space. Here, the cassette loading recognition switch 53 is employed as a third sensor.

Figures 6A, 6B:
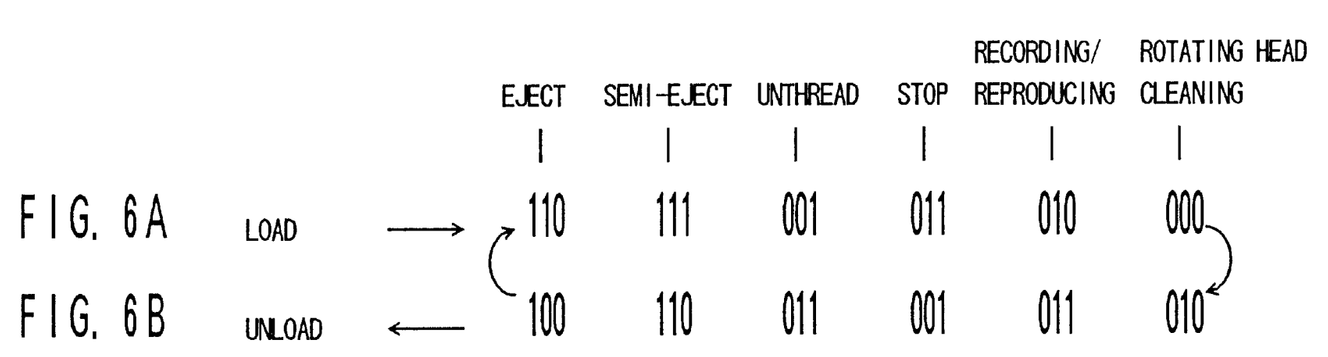
FIGS. 6A, 6B, 6C, 6D and 6E are diagrams for explaining the operation of the operating mode shift detection device.
Figure 6C:
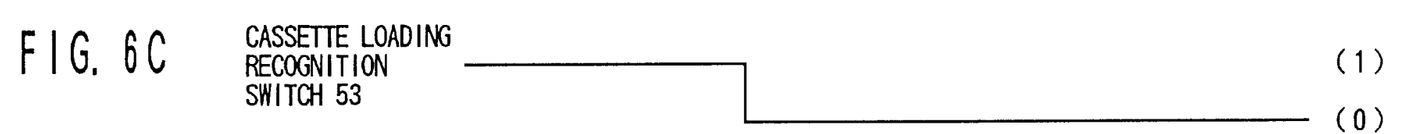
Figure 6D:
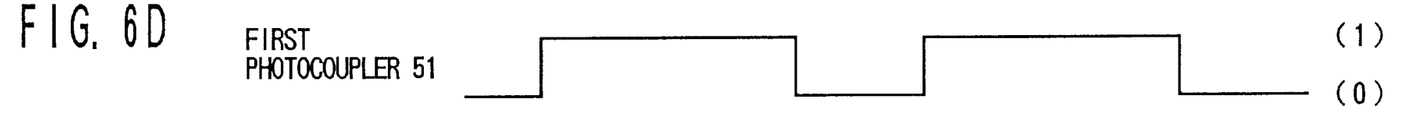
Figure 6E:
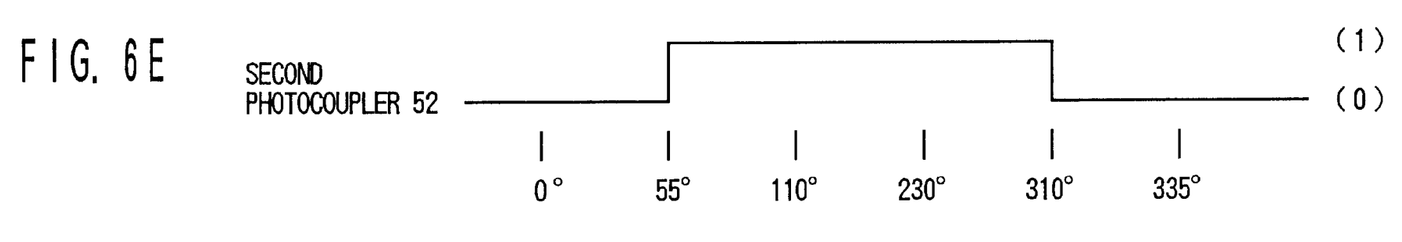

FIG. 6A shows a change in combination signal in order starting from the first photocoupler 51 signal, the second photocoupler 52 signal and the cassette loading recognition switch 53 signal, when the DAT streamer 20 is in the load mode. FIG. 6B shows a change in combination signal when the DAT streamer 20 is in the unload mode.

When commencing the loading mentioned above, a signal "100" is supplied to the control circuit 41 in the order of first a signal from the first photocoupler 51, then a signal from the second photocoupler 52 and finally a signal from the cassette loading recognition switch 53.

The mode gear 22 is synchronized with the cam gear 23 and rotates clockwise. When the mode gear 22 begins to rotate, the combination signal changes to "110" and the control circuit 41 detects that the DAT streamer 20 is in the eject mode. When the mode gear rotates to approximately 55 degrees the combination signal changes to "111" and the control circuit 41 detects that the DAT streamer 20 has shifted from eject mode to the semi-eject mode. When the mode gear 22 further rotates to approximately 110 degrees the combination signal changes to "001" and the control circuit 41 detects that the DAT streamer has shifted from the semi-eject mode to the unthread mode. When the mode gear 22 further rotates to approximately 230 degrees the combination signal changes to "011" and the control circuit 41 detects that the DAT streamer 20 has shifted from the unthread mode to the stop mode. When the mode gear 22 further rotates to approximately 310 degrees the combination signal changes to 010 and the control circuit 41 detects that the DAT streamer has shifted from the stop mode to the recording/reproducing mode. When the mode gear 22 further rotates to approximately 335 degrees the combination signal changes to "000" and the control circuit 41 detects that the DAT streamer 20 has shifted from the recording/reproducing mode to the rotating head cleaning mode.

If in this state an unload is carried out, then the combination signal changes from "000" to "010" and the control circuit 41 detects that the DAT streamer 20 has shifted to a rotary head cleaning mode during the unload mode. When the mode gear rotates counter-clockwise to approximately 310 the combination signal changes to 011 and the control circuit 41 detects that the DAT streamer 20 has shifted from a rotating head cleaning mode to a recording/reproducing mode. When the mode gear 22 further rotates to approximately 230 degrees the combination signal changes to "001" and the control circuit 41 detects that the DAT streamer 20 has shifted from a recording/reproducing mode to a stop mode. When the mode gear 22 further rotates to approximately 110 degrees the combination signal changes to "011" the control circuit 41 detects that the DAT streamer has shifted from the stop mode to the unthread mode. When the mode gear 22 further rotates to approximately 55 degrees the combination signal changes to "110" and the control circuit 41 detects that the DAT streamer 20 has shifted from the unthread mode to the semi-eject mode. When the mode gear 22 further rotates to approximately 0 degrees the combination signal changes to "100" and the control circuit 41 detects that the DAT streamer 20 has shifted from the semi-eject mode to the eject mode.

The first photocoupler 51 and the second photocoupler 52 do not contact either the first or second annular ribs 22a, 22b, so the presence of dirt, dust and so on does not affect the output of the "0" and "1" signals. Accordingly, the shifting of the DAT streamer between operating modes can be detected with a high degree of reliability and without fear of wearing out moving parts.

Additionally, two photocouplers disposed opposite the mode gear 22 are sufficient because the cassette loading recognition switch 53 output is used. Accordingly, the mode gear 22 with its limited diameter can easily accommodate the first and second photocouplers 51 and 52.

Next, a description will be given of variations of the operating mode shift detection device 40.

Figure 7:
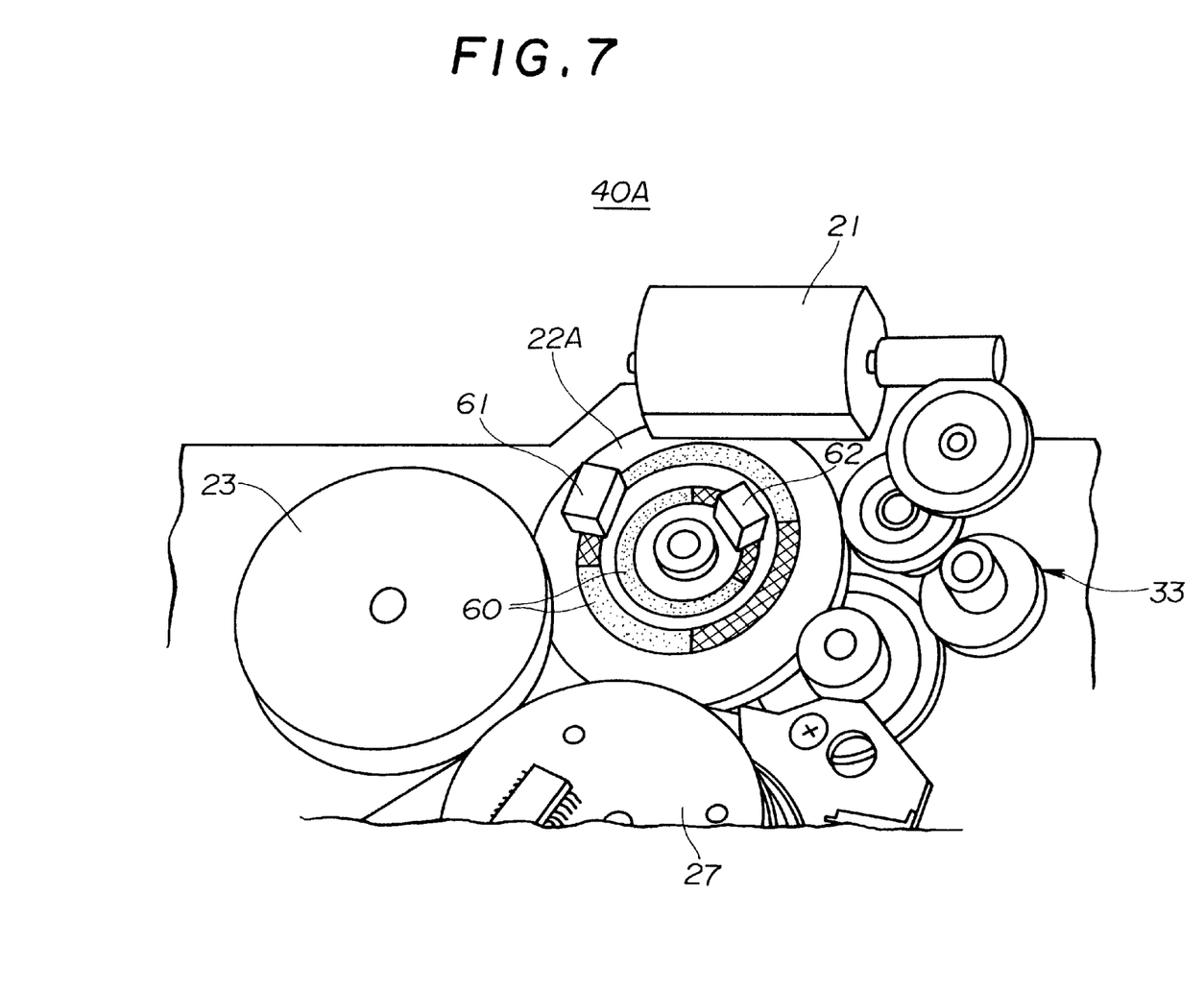
FIG. 7 shows a first variation of the operating mode shift detection device.

FIG. 7 shows a first variation of the operating mode shift detection device 40A. In this operating mode shift detection device 40A, a black-and-white pattern 60 is formed on a mode gear 22A, with photosensors 61 and 62 mounted on a printed circuit board not shown in the drawing detecting the black-and-white pattern 60.

Figure 8:
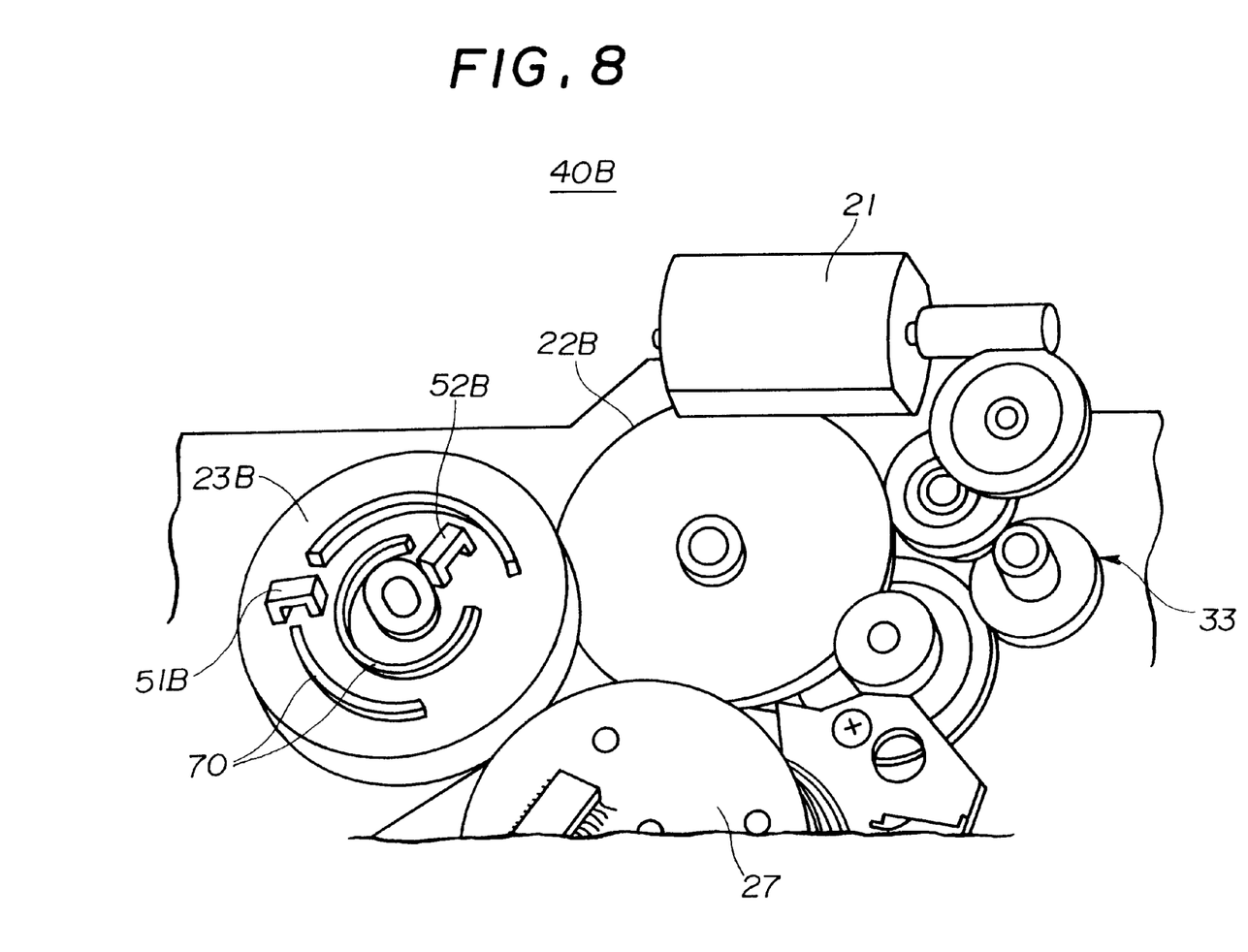
FIG. 8 shows a second variation of the operating mode shift detection device.

FIG. 8 shows a second variation of the operating mode shift detection device 40B. In this operating mode shift detection device 40B, annular ribs 70 are formed on top of a cam gear 23B, with first and second photocouplers 51B and 52B mounted on a printed circuit board not shown in the drawing detecting the annular ribs 70.

Figure 9:
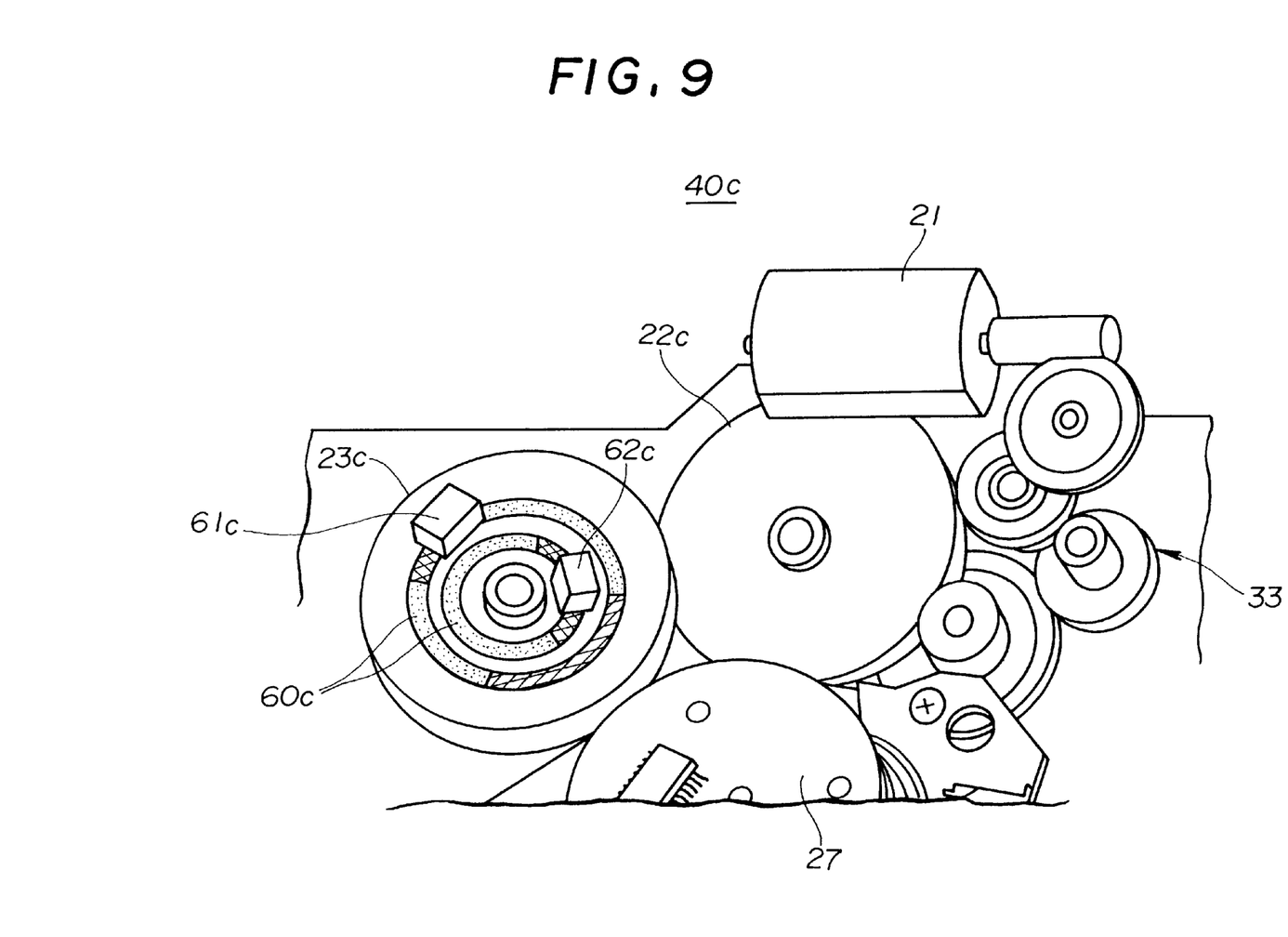
FIG. 9 shows a third variation of the operating mode shift detection device.

FIG. 9 shows a third variation of the operating mode shift detection device 40C. In this operating mode shift detection device 40C, a black-and-white pattern 60C is formed on a cam gear 23C, with photosensors 61C and 62C mounted on a printed circuit board not shown in the drawing detecting the black-and-white pattern 60.

The above description is provided in order to enable any person skilled in the art to make and use the invention and sets forth the best mode contemplated by the inventor of carrying out the invention.

The present invention is not limited to the specifically disclosed embodiment, and variations and modifications may be made without departing from the scope of the present invention.

The present application is based on Japanese Priority Application No. 10-281556 filed on Oct. 2, 1998, the entire contents of which are hereby incorporated by reference.

What is claimed is:

1. A magnetic tape recording/reproducing apparatus adapted for loading a magnetic tape cassette, comprising:

a magnetic head;

a magnetic tape loading mechanism loading and unloading a magnetic tape cassette and loading and unloading a magnetic tape within the magnetic tape cassette to the magnetic head, the magnetic tape loading mechanism assuming a plurality of operating states;

an optical detector for optically detecting a shifting of the magnetic tape loading mechanism from one operating state to another operating state; and a switch detecting a loading of the magnetic tape cassette, wherein the magnetic tape loading mechanism comprises a rotating member that rotates according to the plurality of operating states and the optical detector detects an angle of rotation of the rotating member, wherein the rotating member has an annular rib and the optical detector detects a presence or absence of the annular rib, the optical detector and the switch outputting a unique combination of digital signals corresponding to a presence or absence of the annular rib, the combination of digital signals output when the rotating member moves in a loading direction and the combination of signals output when the rotating member moves in an unloading direction being different from each other so as to indicate different operating states.

2. A magnetic tape recording/reproducing apparatus adapted to load a magnetic tape cassette, comprising:

a magnetic head;

a cam gear rotatably driven by motor;

a magnetic tape loading mechanism operated by the rotation of the cam gear, the magnetic tape loading mechanism loading and unloading the magnetic tape cassette and loading and unloading a magnetic tape within the magnetic tape cassette to the magnetic head, the magnetic tape loading mechanism assuming a plurality of operating states;

a rotating member rotating in synchrony with the cam gear and having a plurality of optical detectors;

a switch detecting a loading of the magnetic tape cassette; and a control circuit detecting a shifting of the magnetic tape loading mechanism from one operating state to another operating state based on an output from the plurality of optical detectors and an output from the switch, wherein the rotating member has an annular rib and the optical detector detects a presence or absence of the annular rib, the optical detector and the switch outputting a unique combination of digital signals corresponding to a presence or absence of the annular rib, the combination of digital signals output when the rotating member moves in a loading direction and the combination of signals output when the rotating member moves in an unloading direction being different from each other so as to indicate different operating states.

* * * * *